(12) United States Patent
De La Torre

(10) Patent No.: US 11,156,736 B1
(45) Date of Patent: Oct. 26, 2021

(54) DEVICE FOR LOCATING STUDS ON A SURFACE

(71) Applicant: Jesus De La Torre, Aurora, IL (US)

(72) Inventor: Jesus De La Torre, Aurora, IL (US)

( * ) Notice: Subject to any disclaimer, the term of this patent is extended or adjusted under 35 U.S.C. 154(b) by 82 days.

(21) Appl. No.: 16/554,842

(22) Filed: Aug. 29, 2019

(51) Int. Cl.
| | | |
|---|---|---|
| *G01N 27/72* | (2006.01) |
| *G01R 33/00* | (2006.01) |
| *G01V 3/08* | (2006.01) |
| *G01R 33/02* | (2006.01) |
| *G01C 15/00* | (2006.01) |
| *G01B 7/06* | (2006.01) |
| *G01B 7/00* | (2006.01) |
| *G01B 7/02* | (2006.01) |
| *G01B 7/30* | (2006.01) |
| *G01B 11/06* | (2006.01) |

(52) U.S. Cl.
CPC .............. *G01V 3/08* (2013.01); *G01B 7/003* (2013.01); *G01B 7/023* (2013.01); *G01B 7/085* (2013.01); *G01B 7/105* (2013.01); *G01B 7/30* (2013.01); *G01B 11/0608* (2013.01); *G01C 15/004* (2013.01); *G01C 15/008* (2013.01); *G01R 33/02* (2013.01); *B65H 2220/03* (2013.01); *B65H 2220/11* (2013.01)

(58) Field of Classification Search
CPC ........ G01B 7/105; G01B 7/003; G01B 7/023; G01B 7/085; G01B 7/30; G01B 11/0608; B65H 2220/11; B65H 2220/03; G01V 3/08; G01R 33/02; G01C 15/004; C01C 15/008
USPC .................................... 324/51, 55, 200, 226
See application file for complete search history.

(56) References Cited

U.S. PATENT DOCUMENTS

| | | |
|---|---|---|
| 7,027,480 B2 | 4/2006 | Marshall et al. |
| 7,690,124 B1 | 4/2010 | Henry |
| 9,069,028 B2 | 6/2015 | Ebner et al. |
| 2006/0013278 A1* | 1/2006 | Raskin ................. G01C 15/004 372/109 |
| 2015/0091553 A1* | 4/2015 | Wong ....................... G01V 3/15 324/207.11 |
| 2020/0225034 A1* | 7/2020 | Gould .................. G01C 15/004 |

* cited by examiner

*Primary Examiner* — Raul J Rios Russo
(74) *Attorney, Agent, or Firm* — Sanchelima & Associates PA; Christian Sanchelima; Jesus Sanchelima

(57) ABSTRACT

A device for locating studs on a surface such as a wall is disclosed. The device comprises a housing, a plurality of magnets disposed in the housing, a level placed between the plurality of magnets and line lasers in which one line laser is provided at one end of the housing and another line laser is provided at an opposite end of the housing. A flux density of the plurality of magnets is used to determine a location and a distance between the studs on the surface. The level is used to accurately determine the position of the studs. The line lasers are configured to emit laser beams at each side of the housing to label location of successive studs for remainder of the surface based on the distance calculated using the plurality of magnets and the level.

9 Claims, 2 Drawing Sheets

DEVICE FOR LOCATING STUDS ON A SURFACE

BACKGROUND OF THE INVENTION

1. Field of the Invention

The present disclosure generally relates to stud locating devices or stud finders. More specifically, the present disclosure relates to a device for locating a stud on a surface and labeling the location of successive studs on the remainder of a surface without moving the device.

2. Description of the Related Art

It is known that studs are generally used as vertical framing members in a building's wall. The studs include frames or boards that function as framing elements in the building, supporting the walls. The studs might be spaced either at 16 or 24 inches on-center, measured from center to center, along the wall and run between the floor and ceiling. During the construction of the building walls, at first the studs are erected and then the studs are covered with gypsum wall board, also known as sheetrock, or some other type of covering material such as wood, plaster, metal or any other material. Once constructed, the studs are concealed behind the wall in that the studs are not visible to the human eye.

After construction, if a user wishes to hang objects such as large pictures, mirrors, shelves, television mounting systems and so on, then the user may have to locate the studs to anchor the objects to the studs with the help of fasteners and hangers. This is because the fasteners hold the objects better as the center of a stud and provide good support for the fasteners. Since the user cannot see the studs; the user relies on stud finders or stud locators to locate studs behind the wall.

Traditional solutions to locate the studs included locating studs by tracing or mapping their location on to the wall during installation. For example, mapping typically involved marking the drywall along a pair of spaced horizontal axis at set distances, and then using a straight-edge to trace a vertical line that connects each pair of marks and thereby illustrating the location of each stud. While this solution helps to locate the studs, the tracing could often be very time-consuming and lack the accuracy required for proper drywall installation. Other early solutions included pounding or inserting a small nail into the wall until the nail hits a stud. However, this technique would generally be tedious, time consuming, and generally results in several holes formed within the drywall.

In order to overcome the disadvantages of the traditional solutions in locating the studs, electronic stud finders have been introduced. In addition, stud finders comprising magnets have been proposed for identifying metal objects behind a wall using a magnet and dispensing a magnet on the wall so that it will remain on the wall through magnetic attraction to the metal object.

Several stud finders have been disclosed in the past. An example of the stud finders is disclosed in U.S. Pat. No. 7,027,480. In U.S. Pat. No. 7,027,480B2, it is disclosed that a laser level disposable on a reference surface includes a housing, a line laser disposed within the housing for emitting a laser beam along a path, a lens disposed in the path for converting the laser beam into a planar beam. The planar beam thus forms a line on the reference surface. The laser level also includes an electronic distance measurement circuit disposed within the housing for measuring distance. The distance measurement circuit including a display for showing the measured distance.

Another example is disclosed in a U.S. Pat. No. 9,069,028. In U.S. Pat. No. 9,069,028B2, it is disclosed that provided is a stud finder for determining the location of a stud within a wall. The stud finder includes a body having an internal compartment formed therein which is sized and configured to house a magnetic element therein. The stud finder is moveable along the wall to place the magnetic element in magnetic attraction with metallic fasteners (i.e., nails, screws, etc.) disposed within the stud, such as for securing drywall to the stud. The magnetic attraction urges the magnetic element toward the metallic element to provide a visual indication as to the precise location of the metallic element, as well as the underlying stud.

Another example is disclosed in a U.S. Pat. No. 7,690,124. In U.S. Pat. No. 7,690,124B1, it is disclosed that a self-supporting apparatus and method for locating a stud in a wall and providing a hands-free laser-level with visible indication of the stud includes a body and a rare earth magnet attached to the body. A battery-operated laser assembly is attached to the device and emits a laser-line that is visible on a surface of a wall when it is energized. A means for leveling the laser is attached to the body to align or indicate when the laser-line is plumb or disposed at an angle with respect to vertical.

Although the stud finders discussed above are capable of finding or locating the studs behind a wall, they have several disadvantages. For instance, in order to locate the studs, at first the user has to determine how high on the wall he should begin looking for a stud. Further, the user has to place the stud finder on the wall by positioning the stud finder on the wall where there is no stud and activate the stud finder. Subsequently, the user has to hold the stud finder against the wall and move the stud finder along the surface of the wall to locate the studs. The above process of moving the stud finder along the wall to locate the studs takes considerable time and efforts of the user. This is because the user has to locate the stud on the wall, mark the location of the stud, and then either scribe a line on the wall or align a line-laser with the mark on the wall and move the stud finder to locate another stud and repeat the process.

Other documents describing the closest subject matter provide for a number of more or less complicated features that fail to solve the problem in an efficient and economical way. None of these patents suggest the novel features of the present invention. Specifically, none of the disclosures in the art disclose a device for locating studs on a wall using laser beams without moving the device along the wall.

Therefore, there is a need to provide a device for locating studs on a wall using laser beams without moving the device along the wall.

SUMMARY OF THE INVENTION

It is one of the objects of the present invention to provide a device for locating studs on a surface and that avoids the drawbacks of the prior art.

It is one object of the present invention to provide a device for locating studs on a surface such as a wall using laser beams without moving the device along the surface.

It is one object of the present invention to provide a device for locating a first stud and labeling location of successive studs on a surface without moving the device along the surface.

Further objects of the invention will be brought out in the following part of the specification, wherein detailed description is for the purpose of fully disclosing the invention without placing limitations thereon.

BRIEF DESCRIPTION OF THE DRAWINGS

With the above and other related objects in view, the invention consists in the details of construction and combination of parts as will be more fully understood from the following description, when read in conjunction with the accompanying drawings in which.

DETAILED DESCRIPTION OF THE EMBODIMENTS OF THE INVENTION

The following detailed description is intended to provide example implementations to one of ordinary skill in the art, and is not intended to limit the invention to the explicit disclosure, as one or ordinary skill in the art will understand that variations can be substituted that are within the scope of the invention as described.

The present invention discloses a device for locating studs on a surface. The device comprises a housing, a plurality of magnets disposed in the housing, a level placed between the plurality of magnets and line lasers in which one line laser is provided at one end of the housing and another line laser is provided at an opposite end of the housing. Flux density of the plurality of magnets is used to determine location and distance between the studs on the surface. The level is used to accurately determine the position of the studs. The line lasers are configured to emit laser beams at each side of the housing to label location of successive studs on the remainder of the surface based on the distance calculated using the plurality of magnets and the level.

Various features and embodiments of a device for locating studs on a surface are explained in conjunction with the description of FIGS. 1-4.

Figure 1:
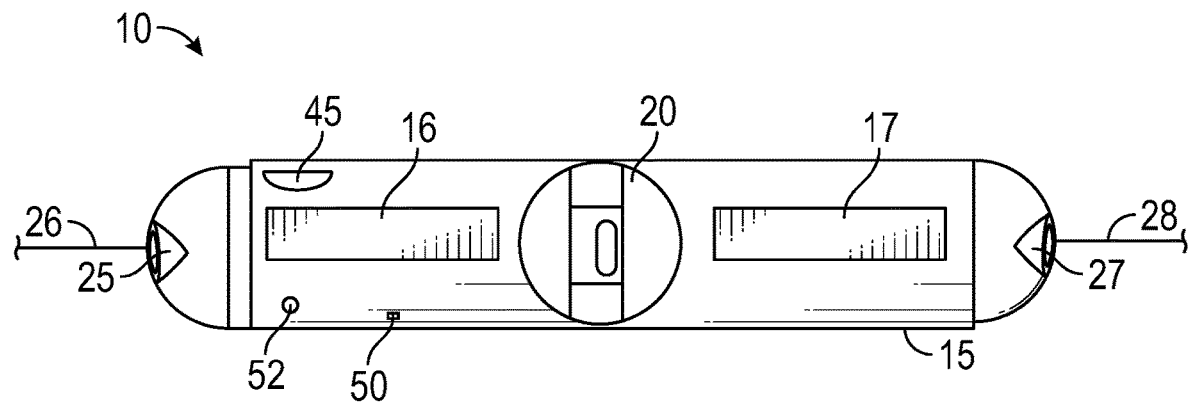
FIG. 1 illustrates a schematic diagram of a device used for locating studs, in accordance with one embodiment of the present disclosure.
Figure 2:
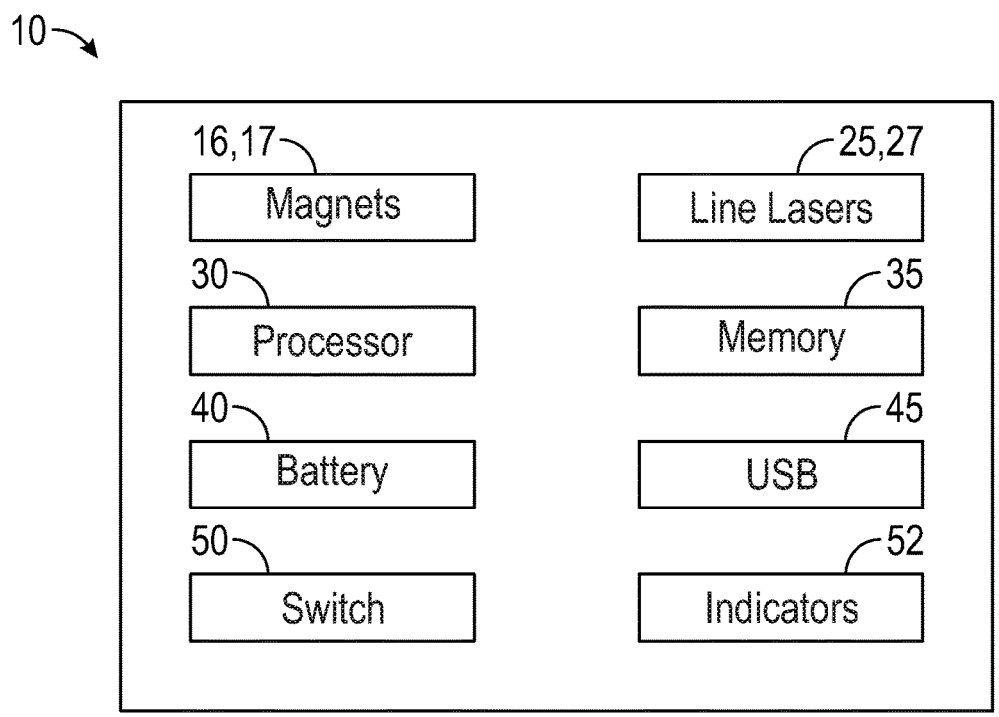
FIG. 2 illustrates a block diagram of the device used for locating studs, in accordance with one embodiment of the present disclosure.

Referring to FIGS. 1 and 2, a schematic and a block diagram, respectively of a device 10 for locating studs on a surface is disclosed. The device 10 comprises a housing 15. Housing 15 might be made up of metal, plastic, wood or any other material. Preferably, housing 15 is made up of lightweight material to minimize its weight. Further, housing 15 might be formed from a hard impact resistant, preferably moldable material such as a hard-thermoplastic material such as ABS or polystyrene. Housing 15 might be provided in square, rectangular, cylindrical or combination thereof. In one example, housing 15 might have a length of 10 centimeters to 30 centimeters and a width of 5 centimeters to 15 centimeters. However, it should be obvious to a person skilled in the art to provide housing 15 in various shapes and sizes. For instance, the edges of housing 15 might be provided in an oval shape with a thin perimeter wall.

Housing 15 comprises a plurality of magnets 16, 17. Plurality of magnets 16, 17 might be provided in a horizontal configuration as shown in FIG. 1. Each of plurality of magnets 16, 17 may include a permanent rare earth magnet with strong flux density meaning strong magnetic attraction. Preferably, the plurality of magnets 16, 17 is selected having a flux density in excess of N40 gauss. It should be understood that a grading of N40 is equal to 40 millions Gauss Oersted (40 MGOe), which is the maximum strength that the magnet can be magnetized to. The "N" rating refers to the "Maximum Energy Product" of the material the magnet is made from. Further, plurality of magnets 16, 17 may include a neodymium magnet that is generally measured in units that are in millions of Gauss Oersted (MGOe). Therefore, a magnet grade of N40 or greater, as preferred, has a Maximum Energy Product of 40 million gauss Oersted (40 MGoe) or greater.

Further, device 10 comprises a level 20 disposed in housing 15 between plurality of magnets 16, 17. Level 20 includes a level vertical axis that passes through a center thereof. It should be understood that level 20 aligns with the vertical axis of housing 15. In other words, the vertical axis of level 20 is perpendicular to the surface such as the ground. Level 20 is made to spin within a ring-like structure in that the level moves to a right side if the magnet such as magnet 17 placed at a right side of level 20 detects presence of a stud due to flux density.

Further, device 10 comprises a plurality of line lasers 25, 27 being laser diodes. Each of line lasers 25, 27 is provided at respective ends of housing 15. As can be seen, a first line laser 25 is provided at one end of housing 25 and a second line laser 27 is provided at an opposite end of housing 15.

Furthermore, device 10 comprises a processor 30, a memory 35 and a battery 40 disposed in housing 15, as shown in FIG. 2. Processor 30 may be implemented as one or more microprocessors, microcomputers, controllers, digital signal processors, central processing units, state machines, logic circuitries, and/or any devices that manipulate signals based on operational instructions. Among other capabilities, processor 30 is configured to fetch and execute computer-readable instructions or program instructions stored in memory 35.

Memory 35 may include any computer-readable medium known in the art including, for example, volatile memory, such as static random access memory (SRAM) and dynamic random access memory (DRAM), and/or non-volatile memory, such as read only memory (ROM), erasable programmable ROM, flash memories, hard disks, and so on.

Battery 40 may include a rechargeable battery, for example a Lithium-Ion battery. Battery 40 is used to power the components to operate device 10.

Further, device 10 may comprise a Universal Serial Bus (USB) port 45 at an outer surface of housing 15, as shown in FIG. 1. It should be understood that USB port 45 is electrically coupled to battery 40. Further, it is obvious to a person skilled in the art that USB port 45 might be used to charge battery 40. Further, device 10 may comprise a switch 50 which can include a push-button type switch or toggle switch or any other type switch which is used to switch ON and OFF the components of device 10. It should be understood other type of switches might also be used to turn ON and OFF the components of device 10.

In one implementation, device 10 might be provided with visual indicators 52 at an outer surface of housing 15 configured to illuminate in different colors to indicate status of various aspects of device 10. For example, the visual indicators 52 may include a light-emitting diode (LED) light bulb, which is configured to illuminate in different colors to indicate various charge levels of battery 40. Alternatively, visual indicators 52 might be configured to illuminate/flash intermittently or continuously to indicate detection of a stud by device 10. Device 10 is configured to instruct each of the plurality of line lasers 25, 27 to emit laser beams 26, 28 upon detecting location of a stud.

Figure 3:
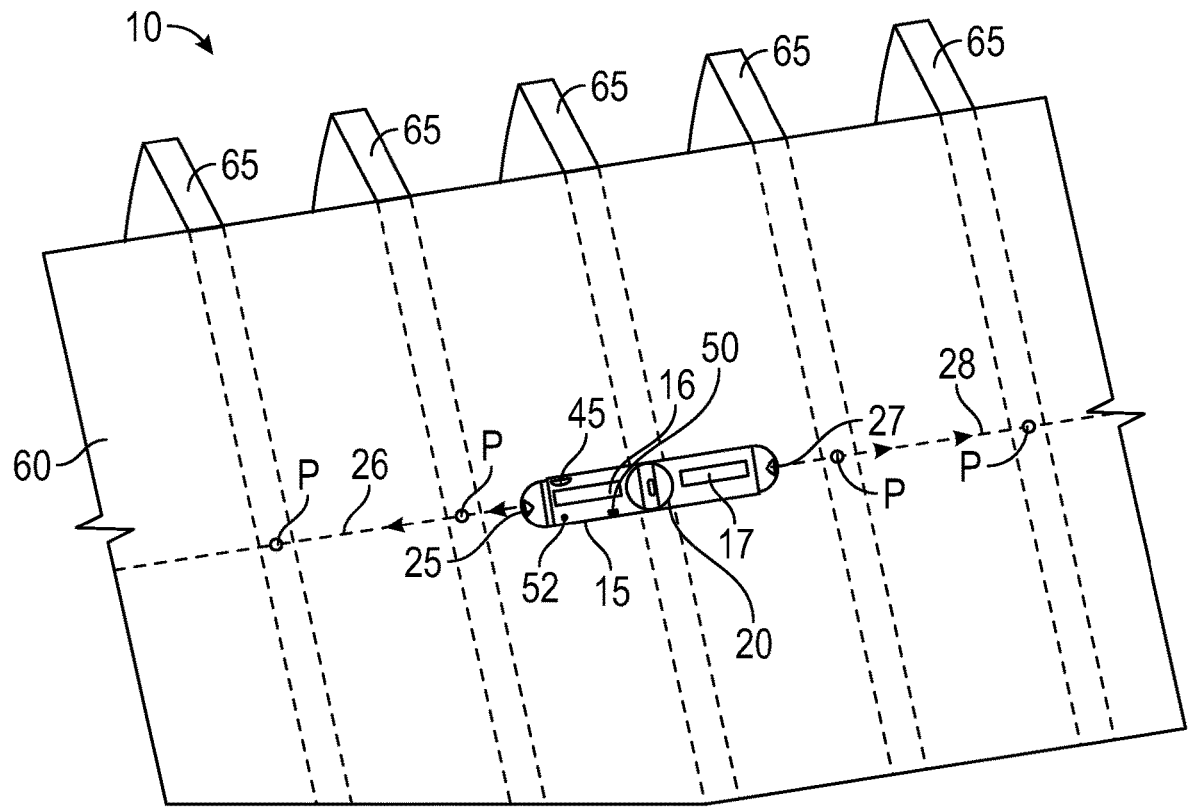
FIG. 3 illustrates a perspective view of the device placed against a surface such as a wall to locate studs, in accordance with one embodiment of the present disclosure.

Now referring to FIG. 3, operation of device 10 for locating studs on a surface 60 for example, a drywall, is shown in accordance with one embodiment of the present disclosure. The current embodiment is explained considering that surface 60 is a wall, however other surfaces including but not limited to flooring, ceiling and other surfaces may be referred as surface where studs are provided behind or underneath.

As known, studs 65 are generally used as vertical framing members in wall 60. Studs 65 might include frames or boards that function as framing elements in a building, supporting wall 60. Studs 65 might be spaced either 16 or 24 inches on-center, measured from center to center, along wall 60 and run between the floor and ceiling. As known, studs 65 are concealed behind wall 60 and as a result, studs 65 are not visible to human eye.

In order to locate one of studs 65, at first, a user of device 10 might place housing 15 against wall 60 as shown in FIG. 1. After placing device 10 on wall 60, switch 50 might be turned ON. When switch 50 is turned ON, processor 30 detects the flux density of each of plurality of magnets 16, 17. As known, studs 65 are typically kept at equal distances from one another. As a result, when device 10 is placed against wall 60, each of plurality of magnets 16, 17 detects alignment of stud 65. As presented above, level 20 is made to spin right within a ring-like structure in that level 20 moves to a right side if the magnet such as magnet 17 detects the strong presence of one of studs 65 due to flux density. Similarly, level 20 is made to spin left within the ring-like structure in that the level moves to a left side if the magnet such as magnet 16 placed at a left side of level 20 detects the presence of a stud due to flux density. In order to ensure that plurality of magnets 16, 17 have balanced flux density, device 10 position is adjusted by moving device 10 in such a way that level 20 comes to a center of the ring-like structure indicating that plurality of magnets 16, 17 have perceived as being at its strongest and balanced, thereby determining accurate location of studs 65 behind wall 60.

Upon detecting the position of level 20 being at the center, processor 30 calculates the distance between studs 65 from level 20. In other words, processor 30 calculates the distance between two consecutive studs 65. Upon calculating the distance between two consecutive studs 65, processor 30 calibrates plurality of line lasers 25, 27 to emit laser beams 26, 28 at the same distance calculated for studs 65. As can be seen from FIG. 3, each of plurality of line lasers 25, 27 are configured to emit laser beams 26, 28 at either side of housing 15 to label a location P of the successive studs 65 along the line of axis of the laser beams 26, 28 across entire length of the wall 60. In other words, line laser 25 is instructed to emit laser beam 26 along the line of axis to label location P of successive studs 65 based on the distance calculated for studs 65 by processor 30. It should be understood that line laser 25 emits the laser beam 26 until the remainder of wall 60 such as the end of the surface of wall 60. Similarly, line laser 27 is instructed to emit laser beam 28 along the line of axis to label location P of successive studs 65 based on the distance calculated for studs 65 by processor 30 on an opposite side until the remainder of wall 60 such as the end of the surface of wall 60. It should be understood that labeling of location P indicates position of successive studs 65 with respect to a previous one of studs 65. As studs 65 are placed at equal distances apart, plurality of line lasers 25, 27 emit the laser beams 26, 28 at equal distances to label location P of the successive studs 65. As specified above, the plurality of line lasers 25, 27 emit the laser beams 26, 28 until the end of wall 60 is reached. As such, the plurality of line lasers 25, 27 emit the laser beams 26, 28 for the remainder of wall 60 from the location of the plurality of line lasers 25, 27 to label location P of the studs 65.

Device 10 employs plurality of line lasers 25, 27 to emit laser beam 26, 28 from a place where the distance between two studs 65 is determined with the help of plurality of magnets 16, 17. Upon labeling location P of studs 65, the user may leave a mark or utilize location P to mount a fastener for hanging objects such as pictures, mirrors, shelves, television mounting systems and so on. After labeling location P of studs 65, when laser beams 26, 28 are no longer needed. The user may turn OFF switch 50 to conserve and life of battery 35.

It should be understood that device 10 allows labeling location P of studs 65 along an entire length of wall 60 from one place without having to move device 10 along the surface of wall 60 as in the prior art. As a result, device 10 saves time and effort of the user in locating and labelling studs 65 on wall 60. Further, level 20 helps to accurately determine the location of a first of studs, based on which the line lasers 25, 27 are used to locate or point or label location P of the other studs 65.

It should be noted that no markings of any kind are placed on wall 60 to label location P of studs 65. The laser beams 26, 28 are used to temporarily indicate or label a line that appears to be scribed on wall 60. However, the moment the line lasers 25, 27 are de-energized, the laser beams 26, 28 disappear without affecting wall 60. This allows easy use of device 10 with line lasers 25, 27 on painted walls or those covered with wallpaper as no holes for fasteners to secure the objects and no markings on the wall are needed.

Based on the above, it is evident that once device 10 with line lasers 25, 27 finds location P of the first of studs 65, it is quick and easy to label adjacent successive or neighboring studs 65. To label successive studs 65, device 10 with the line lasers 25, 27 is placed in a horizontal configuration as shown in FIG. 3.

Figure 4:
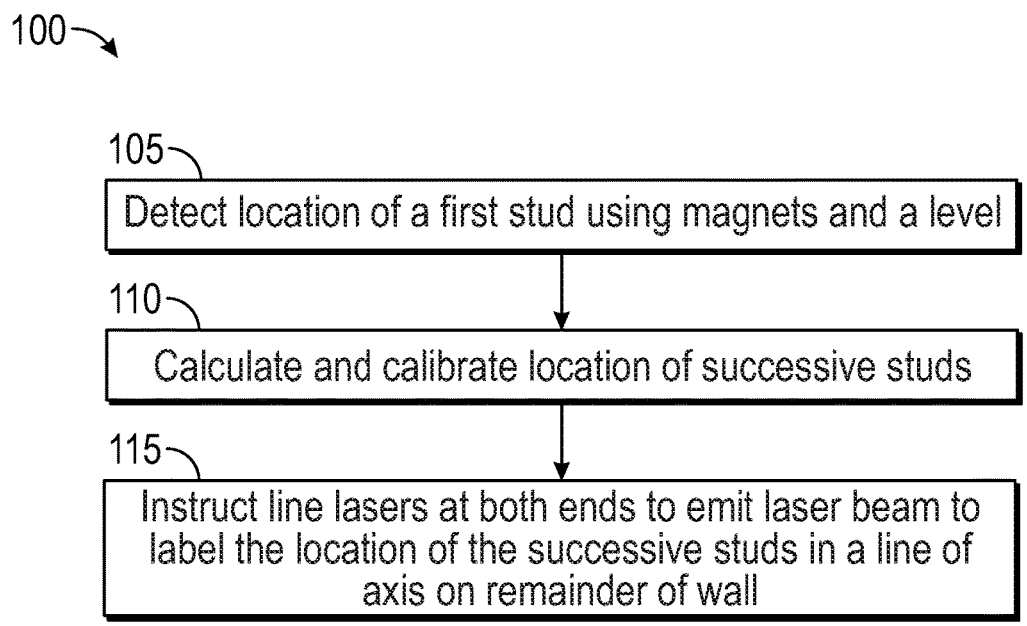
FIG. 4 illustrate a method for locating studs on a surface, in accordance with one embodiment of the present disclosure.

Referring now to FIG. 4, a method 100 for locating studs on a surface such as wall 60 is shown, in accordance with an embodiment of the present disclosure. Method 100 may be described in the general context of computer executable instructions or a sequence of steps to be performed for automated checkout. However, the order in which method 100 is described and is not intended to be construed as a limitation, and any number of the described method blocks can be combined in any order to implement method 100 or alternate methods. Additionally, individual blocks may be deleted from method 100 without departing from scope of the disclosure described herein. For ease of explanation, in the embodiments described below, the method 100 may be implemented in the above-described device 10.

At step 105, location P of a first of studs 65 is detected with the help of plurality of magnets 16, 17 and level 20.

At step 110, based on the distance detected using flux density of the plurality of magnets 16, 17, processor 30 disposed in device 10 is configured to calculate the distance of studs 65. Subsequently, processor 30 calibrates line lasers 25, 27 provided at the ends of housing 15.

At step 115, processor 30 instructs line lasers 25, 27 to emit laser beams 26, 28 to label location P of successive studs 65 in a line of axis of laser beams 26, 28 corresponding to the distance of studs 65 calculated with the help of plurality of magnets 16, 17 and level 20. The successive studs 65 are labeled for the remainder of wall 60 at both ends of device 10.

In other words, each of plurality of line lasers 25, 27 emits laser beams 26, 28, respectively at location P which is calculated based on the distance calculated with the help of plurality of magnets 16, 17 such that location P indicates location of successive studs 65 with respect to a previous one of studs 65. As studs 65 are placed at equal distance, the plurality of line lasers 25, 27 emit laser beams 26, 28 to label location P of the successive studs 65.

Based on the above, it is evident that once the device with the line lasers finds the location of the first stud, it is quick and easy to label adjacent or successive wall studs for the remainder of the surface. This is achieved by employing the plurality of line lasers to emit the laser beam from a place where the distance between the two studs is determined with the help of the plurality of magnets. It should be understood that the device allows labeling the studs along entire length of the wall from one place without having to move the device along the surface of the wall as in the prior art. As a result, the device saves time and effort of the user in locating the studs on the wall. Further, the level helps to accurately determine the location of first stud, based on which the line lasers are used to label location of the other studs.

Upon labeling the location of the studs the user may leave a mark or utilize the label to mount a fastener (not shown) for hanging objects such as pictures, mirrors, shelves, television mounting systems and so on. After labeling the location of the studs, when the laser beams are no longer needed the user may turn OFF the switch to conserve and life of the battery.

It should be noted that no markings of any kind are placed on the wall to indicate position of the studs. The laser beams or laser lines are used to temporarily indicate a line that appears to be scribed on the wall. However, the moment the line lasers are de-energized, the laser beams disappear without affecting surface of the wall. This allows easy use of the device with the line lasers on painted walls or those covered with wallpaper as no holes for fasteners to secure the objects and no markings on the wall are needed.

The drawings shown herein are provided for illustrative purpose only, and shape and size of each components illustrated should not be construed in limited sense. A person skilled in the art will appreciate that components may be added or deleted to incorporate additional features described in the present disclosure and even such disclosures will be within the scope of the present disclosure.

The foregoing description conveys the best understanding of the objectives and advantages of the present invention. Different embodiments may be made of the inventive concept of this invention. It is to be understood that all matter disclosed herein is to be interpreted merely as illustrative, and not in a limiting sense.

What is claimed is:

1. A system for a device to locate a stud, the device comprising:
    a wall;
    studs;
    a housing;
    a plurality of magnets disposed in the housing;
    a level placed between the plurality of magnets;
    line lasers, one of said line lasers is provided at one end of the housing and another of said line lasers is provided at an opposite end of the housing; and
    a flux density of the plurality of magnets determines a location and a distance between the studs on a surface, said surface being said wall, said level is used to accurately determine the position of one of the studs, said line lasers emit laser beams at each side of the housing to label location of successive said studs based on the distance calculated using the plurality of magnets and the level.

2. The system of claim 1, wherein the plurality of magnets are provided in a horizontal configuration.

3. The system of claim 1, wherein the plurality of magnets have said flux density in excess of N40 gauss.

4. The system of claim 1, wherein the level includes a level vertical axis that passes through a center thereof, and wherein the level aligns with the vertical axis of the housing.

5. The system of claim 1, wherein the line lasers are laser diodes.

6. The system of claim 1, further comprises visual indicators to indicate detection of said studs.

7. The system of claim 1 further comprises a processor to receive said flux density of each of the plurality of magnets and to calibrate the line lasers to emit laser beams at each side of the housing to label said location of the studs based on the distance calculated using the plurality of magnets.

8. The system of claim 1, wherein the line lasers emit the laser beams to label the location of the successive said studs for the remainder of the wall.

9. A system for a device for locating a stud, the device comprising:
    a wall;
    studs;
    a housing;
    a plurality of magnets disposed in the housing;
    a level placed between the plurality of magnets, said level includes a level vertical axis that passes through a center thereof, and wherein the level aligns with the vertical axis of the housing;
    a processor disposed in the housing, wherein the processor is configured to receive a flux density of each of the plurality of magnets;
    line lasers, one of said line lasers provided at one end of the housing and another of said line lasers is provided at an opposite end of the housing;
    said processor receives said flux density of each of the plurality of magnets and determines a location and a distance between the studs on a surface, said surface being said wall, said processor further calibrates the line lasers to emit laser beams at each side of the housing to label said location of the successive said studs based on the distance calculated using the plurality of magnets and the level.

* * * * *